US 012288667 B2

United States Patent
Potocek et al.

(10) Patent No.: US 12,288,667 B2
(45) Date of Patent: Apr. 29, 2025

(54) LIVE-ASSISTED IMAGE ACQUISITION METHOD AND SYSTEM WITH CHARGED PARTICLE MICROSCOPY

(71) Applicant: FEI Company, Hillsboro, OR (US)

(72) Inventors: Pavel Potocek, Eindhoven (NL); Bert Henning Freitag, Brueggen (DE); Maurice Peemen, Rijsbergen (NL)

(73) Assignee: FEI Company, Hillsboro, OR (US)

( * ) Notice: Subject to any disclaimer, the term of this patent is extended or adjusted under 35 U.S.C. 154(b) by 298 days.

(21) Appl. No.: 17/831,147

(22) Filed: Jun. 2, 2022

(65) Prior Publication Data

US 2023/0395351 A1  Dec. 7, 2023

(51) Int. Cl.
| | |
|---|---|
| H01J 37/28 | (2006.01) |
| G06T 7/00 | (2017.01) |
| H01J 37/20 | (2006.01) |
| H01J 37/22 | (2006.01) |
| H01J 37/244 | (2006.01) |
| H01J 37/26 | (2006.01) |

(52) U.S. Cl.
CPC .......... *H01J 37/28* (2013.01); *G06T 7/0004* (2013.01); *H01J 37/20* (2013.01); *H01J 37/222* (2013.01); *H01J 37/244* (2013.01); *H01J 37/265* (2013.01); *G06T 2207/10061* (2013.01); *G06T 2207/20081* (2013.01); *H01J 2237/226* (2013.01)

(58) Field of Classification Search
CPC .......... H01J 37/20; H01J 37/38; H01J 37/222; H01J 37/244; H01J 37/265; H01J 2237/226; G06T 2207/30136; G06T 2207/20081; G06T 2207/30024; G06T 2207/10061; G06T 2207/20084; G06T 2207/10056; G06T 2207/20182
See application file for complete search history.

(56) References Cited

U.S. PATENT DOCUMENTS

| 10,068,345 B1 | 9/2018 | Zhang et al. |
| 2020/0143533 A1* | 5/2020 | Choi ............. G06T 7/0012 |
| 2022/0138927 A1* | 5/2022 | Hollenberg ........ G01Q 30/04 |
| | | 382/159 |

FOREIGN PATENT DOCUMENTS

| KR | 101969242 B1 | 4/2019 |
| KR | 102253227 B1 | 5/2021 |

OTHER PUBLICATIONS

Lee et al., "Electron dose dependence of signal-to-noise ratio, atom contrast and resolution in transmission electron microscope images," *Ultramicroscopy*, pp. 3-12 (Feb. 2014).

(Continued)

*Primary Examiner* — David E Smith
*Assistant Examiner* — Hsien C Tsai
(74) *Attorney, Agent, or Firm* — Klarquist Sparkman, LLP (57) ABSTRACT

A method of imaging a sample includes acquiring one or more first images of a region of the sample at a first imaging condition with a charged particle microscope system. The one or more first images are applied to an input of a trained machine learning model to obtain a predicted image indicating atom structure probability in the region of the sample. An enhanced image indicating atom locations in the region of the sample based on the atom structure probability in the predicted image is caused to be displayed in response to obtaining the predicted image.

20 Claims, 6 Drawing Sheets

(56) References Cited

OTHER PUBLICATIONS

Lin et al., "TEMImageNet training library and AtomSegNet deep-learning models for high-precision atom segmentation, localization, denoising, and deblurring of atomic-resolution images," *Scientific Reports*, vol. 11, 15 pp. (Mar. 2021).
Nazeri et al., "Image Colorization using Generative Adversarial Networks," *Articulated Motion and Deformable Objects*, pp. 85-94 (Jun. 2018).
Rose, "The Sensitivity Performance of the Human Eye on an Absolute Scale," *Journal of the Optical Society of America*, vol. 38, No. 2, pp. 196-208 (Feb. 1948).
Zhu et al., "Unpaired Image-to-Image Translation using Cycle-Consistent Adversarial Networks," arXiv:1703.10593v7, 18 pp. (Aug. 2020).
European Patent Office, International Search Report and Written Opinion for related PCT Application No. PCT/US2023/024373, dated Sep. 22, 2023, 4 pages.
Ronneberger et al., "U-Net: Convolutional Networks for Biomedical Image Segmentation," arxiv.org, May 18, 2015, 8 pages, arXiv:1505.04597v1 [cs.CV].
Ede, "Warwick Electron Microscopy Datasets," arxiv.org, Mar. 2, 2020, 15 pages, arXiv:2003.01113v1 [eess.IV].
Fatermans et al., Single atom detection from low contrast-to-noise ratio electron microscopy images, PhysRevLett. 121, 056101, Jul. 2018.
Van Der Jeught et al., Optimized loss function in deep learning profilometry for improved prediction performance, J. Phys. Photonics 3, 024014, Apr. 2021.

\* cited by examiner

LIVE-ASSISTED IMAGE ACQUISITION METHOD AND SYSTEM WITH CHARGED PARTICLE MICROSCOPY

FIELD

The field relates to charged particle microscopy.

BACKGROUND

Charged particle microscopy involves using a beam of accelerated charged particles as a source of illumination. Example types of charged particle microscopy include transmission electron microscopy, scanning electron microscopy, scanning transmission electron microscopy, and ion beam microscopy.

Scanning transmission electron microscopy, also known as STEM, can be used to acquire high resolution images of samples at an atomic scale. In STEM imaging, an electron beam is scanned over a sample or an area of the sample. The electrons interact with the sample, resulting in elastically scattered electrons exiting the sample. In a transmission imaging mode, the electrons transmitted through the sample are detected and used to form a microscopic image of the sample.

STEM atomic spectroscopy can give insight into the structure of a material. However, obtaining atomic images with sufficient resolution for material structure analysis can be challenging. In a typical atomic spectroscopy workflow, an operator navigates around the sample to find interesting areas on the sample. When the interesting areas are found, a final image of the interesting areas is taken. The navigation involves scanning an electron beam across the sample, or areas of the sample. To obtain atomic resolution images, the electron beam should be aligned with the atom columns in the irradiated areas of the sample, which may require tilting of the sample relative to the electron beam path to find the desired alignment. Many materials of interest have a limited electron dose budget. For these materials, a lengthy navigation to find interesting areas and/or navigation using a high radiation dose (e.g., 100 $e^-/Å^2$) can result in damage to the sample prior to acquiring the final image.

DETAILED DESCRIPTION

Example—General Considerations

The subject matter is described with implementations and examples. In some cases, as will be recognized by one skilled in the art, the disclosed implementations and examples may be practiced without one or more of the disclosed specific details, or may be practiced with other methods, structures, and materials not specifically disclosed herein. All the implementations and examples described herein and shown in the drawings may be combined without any restrictions to form any number of combinations, unless the context clearly dictates otherwise, such as if the proposed combination involves elements that are incompatible or mutually exclusive. The sequential order of the acts in any process described herein may be rearranged, unless the context clearly dictates otherwise, such as if one act requires the result of another act as input.

In the interest of conciseness, and for the sake of continuity in the description, same or similar reference characters may be used for same or similar elements in different figures, and description of an element in one figure will be deemed to carry over when the element appears in other figures with the same or similar reference character. In some cases, the term "corresponding to" may be used to describe correspondence between elements of different figures. In an example usage, when an element in a first figure is described as corresponding to another element in a second figure, the element in the first figure is deemed to have the characteristics of the other element in the second figure, and vice versa, unless stated otherwise.

The word "comprise" and derivatives thereof, such as "comprises" and "comprising", are to be construed in an open, inclusive sense, that is, as "including, but not limited to". The singular forms "a", "an", "at least one", and "the" include plural referents, unless the context dictates otherwise. The term "and/or", when used between the last two elements of a list of elements, means any one or more of the listed elements. The term "or" is generally employed in its broadest sense, that is, as meaning "and/or", unless the context clearly dictates otherwise. When used to describe a range of dimensions, the phrase "between X and Y" represents a range that includes X and Y. As used herein, an "apparatus" may refer to any individual device, collection of devices, part of a device, or collections of parts of devices.

Example—Overview

The subject matter disclosed herein pertains to imaging of a sample with charged particle microscopy under imaging conditions that can result in acquired images with low signal-to-noise ratio (SNR). In these low SNR images, the atom structures in the imaged area of the sample are not clearly visible to the naked eye because of the low resolution of the images. The methods and systems disclosed herein can use low SNR images acquired with charged particle microscopy to generate enhanced images that indicate information about the atomic structure in the imaged area of the sample. The enhanced images can be displayed in a user interface in order to provide live assistance to an operator while navigating on the sample to find critical areas (e.g., inhomogeneous structure) of the sample or during in-situ experiments to capture dynamic effects in sample composition.

In one implementation, the methods and systems disclosed herein can be configured to obtain image data of a region of the sample, generate one or more initial images from the image data, and generate one or more enhanced images that indicate information about the atomic structure in the region of the sample. In various examples, the generation of the one or more enhanced images includes predicting atom structure probability in the sample using a trained machine learning model that accepts the initial image(s) as input. The predicted atom structure probability can be used to detect atom locations in the region of the sample.

In various examples, the imaging conditions that result in acquired images with low SNR can include a low dose of the charged particle beam, short dwell time (or fast scan speed) of the charged particle beam, or sparse scanning. Thus, the methods and systems disclosed herein can enable live-assisted low charged particle beam dose and/or fast scanning and/or sparse scanning of a sample. In some examples, the methods and systems can enable imaging of the sample using a charged particle beam dose that is significantly lower than a dose required to acquire a high resolution image of the sample. Advantageously, an area of the sample can be repeatedly scanned with the low dose during the live assistance before the accumulated irradiation with the low dose will be equivalent to the irradiation with a single high dose scan. The low dose can also help avoid a scenario where the charged particle beam alters the dynamics of the structures in the sample while capturing an image of the sample with live assistance.

Example—Sample Imaging System with Live Assistance

Figure 1:
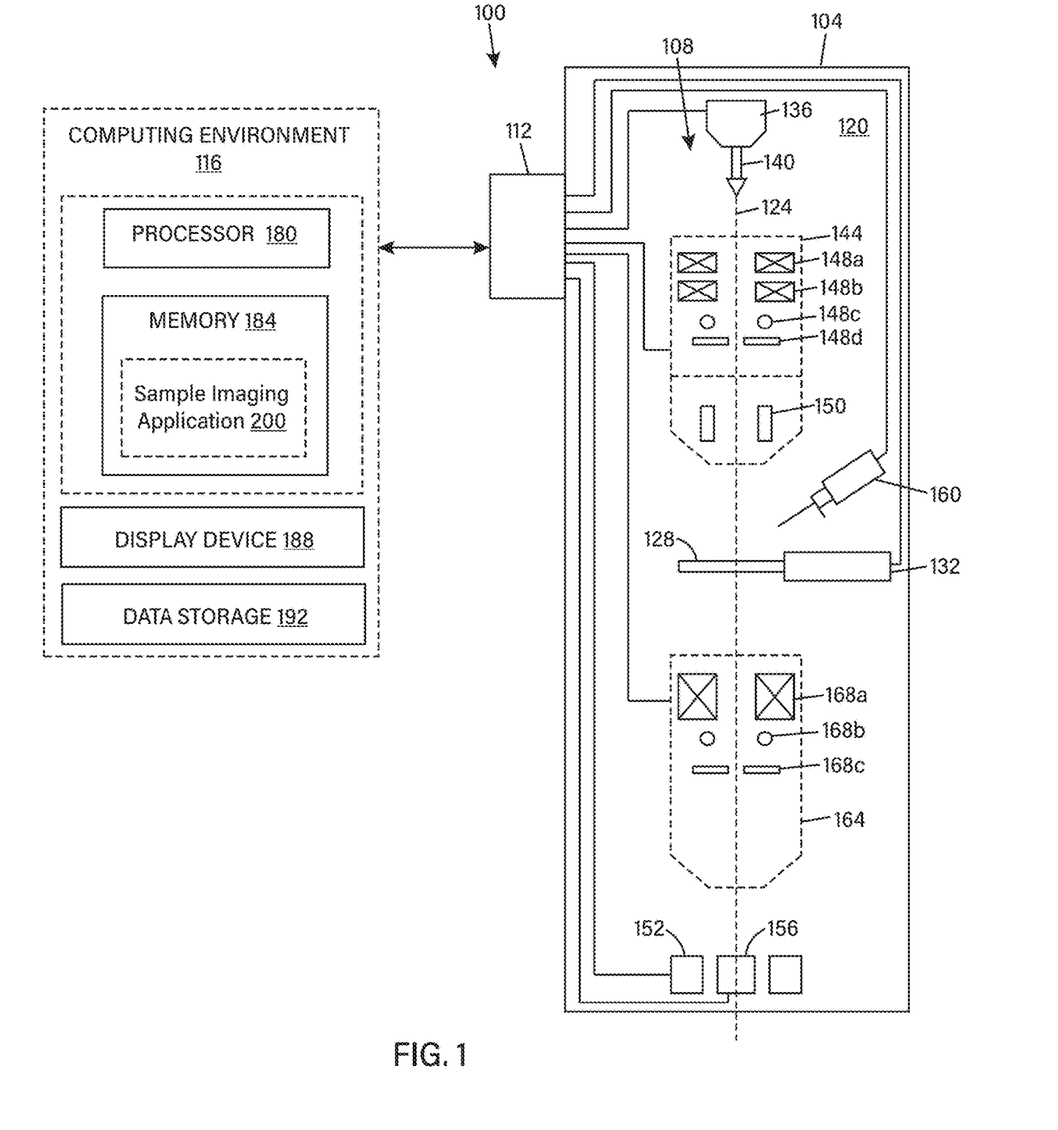
FIG. 1 is a schematic of a system for sample imaging with charged particle microscopy, in accordance with one implementation.

FIG. 1 illustrates one implementation of a system 100 for sample imaging with live assistance. The system 100 includes a charged particle microscope system 104 for investigation and analysis of a sample. The system 100 can further include a computing environment 116 with a sample imaging application 200. In the illustrated example, the charged particle microscope system 104 includes a charged particle microscope 108, enclosed within a vacuum chamber 120, and a controller 112, which can be within or outside the vacuum chamber 120. The controller 112 is communicatively coupled to the computing environment 116.

The controller 112 is connected to various components of the charged particle microscope 108 and can communicate control/power signals to the components as well as receive data from the components. The controller 112 can allow control of operations of the charged particle microscope system 104 from the sample imaging application 200 as well as allow image data acquired by the charged particle microscope 108 to be transmitted to the computing environment 116 and used by the sample imaging application 200. The controller 112 can be implemented with any suitable combination of hardware and software.

Any type of charged particle microscope 108 suitable for acquiring images of a sample can be used in the system 100. For illustration purposes, the charged particle microscope 108 is depicted as a scanning transmission electron microscope (STEM), but the charged particle microscope 108 is not limited to the particular STEM configuration depicted. The STEM can be operated in a STEM mode (i.e., where the charged particle beam is scanned over an area of the sample) or in a transmission electron microscope (TEM) mode (i.e., without scanning the beam). Other examples of microscopes can include, but are not limited to, cryo-electron microscope (cryo-EM), ion based microscope, and proton microscope.

The charged particle microscope 108 includes a first electro-optical system 144 that defines an optical axis 124. A sample 128 to be investigated and/or analyzed can be positioned below the first electro-optical system 144 and along the optical axis 124. The sample 128 is supported by a sample holder 132 (or stage), which in some examples can have capabilities to translate, rotate, and/or tilt the sample. The controller 112 can be connected to the sample holder 132 to provide sample position control signals to the sample holder 132. The sample holder 132 can allow different areas of the sample to be positioned and/or tilted relative to the optical axis 124 (e.g., during navigation on the sample to find areas of interest on the sample).

The charged particle microscope 108 includes a charged particle source 136 positioned above the first electro-optical system 144. The charged particle source 136 can be, for example, an electron source (e.g., a Schottky gun), a positive ion source (e.g., a gallium ion source or a helium ion source), a negative ion source, a proton source, or a positron source. The charged particle source 136 produces a charged particle beam 140. The first electro-optical system 144 receives the charged particle beam 140 and configures the charged particle beam 140 into a field of view on the sample 128.

The first electro-optical system 144 can include one or more electro-optical components. In some examples, the electro-optical components can be connected to the controller 112 to allow the electro-optical power of the components to be set and adjusted by the controller 112. For illustrative purposes, the first electro-optical system 144 can include condenser lenses 148*a*, 148*b*, condenser stigmator 148*c*, and condenser aperture 148*d*. The first electro-optical system 144 can include scan coils 150, which can be operated to scan the charged particle beam 140 over an area of the sample 128. In other examples, the first electro-optical system 144 can have other components or fewer components than illustrated.

When the charged particle beam 140 is incident on the sample 128, the charged particles in the beam interact with the structures (e.g., atoms) in the sample 132 in such a way as to cause various types of radiation to emanate from the sample 132. For example, when the charged particle beam 132 is an electron beam, the radiation that emanates from the sample can include any combination of Auger electrons, secondary electrons, X-rays, backscatter electrons, cathodoluminescence, loss electrons, transmitted electrons, and diffracted electrons. The various types of radiation can be detected and used to form one or more images of the sample.

In one implementation, the charged particle microscope 108 can include one or more detector systems to capture images of the sample 128 with one or more detector modalities. In one example, the charged particle microscope 108 can include a first detector system 152 to acquire image data from the sample 128. The first detector system 152 can include a STEM detector, such as a bright field detector, an annular bright field detector, a dark field detector, an annular dark field detector, a high-angle annular dark field (HAADF) detector, a segmented STEM detector, or an integrated differential phase contrast (iDPC) detector. In one specific example, the first detector system 152 can include a HAADF detector, which detects charged particles (e.g., electrons) that are scattered to higher angles. In another specific example, the first detector system 152 can include an annular bright field detector and an annular dark field detector to capture bright field and dark field images of the sample simultaneously.

In one example, the charged particle microscope 108 can include one or more additional detector systems, for example, a second detector system 156 and a third detector system 160, to obtain additional image data from the sample. For example, the detector systems 156, 160 can be spectroscopy systems. For illustrative purposes, the second detector system 156 is shown positioned below the sample 128, whereas the third detector system 160 is shown positioned above the sample 128. In one specific example, the second detector system 156 can include an electron energy loss spectroscopy, and the third detector system 160 can include an energy dispersive X-ray spectroscopy.

The charged particle microscope 108 can include a second optical system 164 to direct the charged particles transmitted through the sample 128 into the fields of view of the detector systems 152, 156. For illustrative purposes, the second optical system 164 can include an objective lens 168a, an objective stigmator 168b, an objective aperture 168c. In other examples, the second optical system 164 can have other components or fewer components than depicted.

The computing environment 116 can have any suitable configuration to run the sample imaging application 200. For example, the computing environment 116 can include a processor 180, memory 184, a display device 188, and a data storage 192. The sample imaging application 200 can be loaded into memory 184 and executed by the processor 180. The sample imaging application 200 can present a user interface on the display device 188 and can present sample images in the user interface as well as collect microscope control settings from the user interface. The sample imaging application 200 can provide the microscope control settings to the controller 112 and receive detector data from the controller 112. The computing environment 116 can include other components not specifically shown, such as input device(s), other output device(s) besides the display device 188, communication connection(s), other memory besides memory 184, and other processors besides processor 180.

Example—Sample Imaging Application

Figure 2:
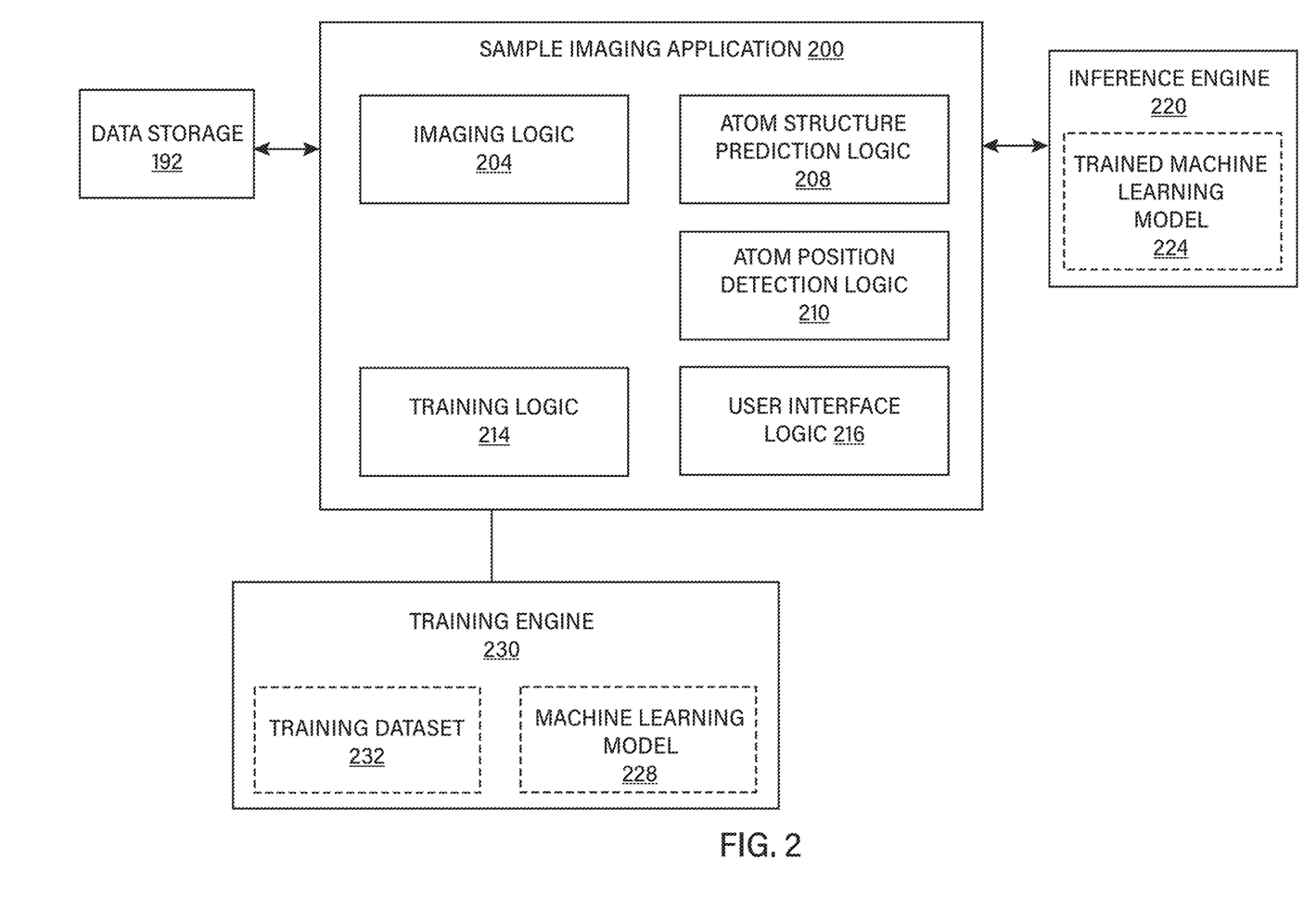
FIG. 2 is a block diagram of an example sample imaging application, according to one implementation.

FIG. 2 illustrates one implementation of the sample imaging application 200. The sample imaging application 200 can include imaging logic 204, atom structure prediction logic 208, atom position detection logic 210, and user interface logic 216. The imaging logic 204 can perform various functions related to acquiring images of a sample. The atom structure prediction logic 208 can perform various functions related to predicting atom structure probability in the acquired images of the sample. The atom position detection logic 210 can perform various functions related to finding positions of atoms in a predicted image including atom structure probability. The user interface logic 216 can perform various functions related to presenting acquired and enhanced images of a sample to a user and receiving input from the user. The sample imaging application 200 can have other logic components and data structures not specifically illustrated.

The imaging logic 204 can perform various functions related to acquiring images of the sample with the charged particle microscope system. During navigation on the sample, the imaging logic 204 can cause the sample to be placed at different positions relative to the field of view of the charged particle beam. For example, the imaging logic 204 can provide the controller (112 in FIG. 1) of the charged particle microscope system with positional information for the sample. In some examples, the imaging logic 204 can derive the positional information for the sample from user-defined settings received from the user interface logic 216. The controller can in turn provide control setpoints to the sample holder (132 in FIG. 1) to translate and/or tilt the sample. In some cases, if the charged particle microscope (108 in FIG. 1) is mounted to a stage, the charged particle microscope may be translated and/or tilted relative to the sample to achieve the desired relative positioning between the sample and the scan field of view of the charged particle beam.

The imaging logic 204 can cause different types of images of the sample to be captured by the charged particle microscope system. For example, the imaging logic 204 can provide the controller of the charged particle microscope system with the detector systems that should be activated during imaging of an area of the sample. In one example, the imaging logic 204 can cause images of the sample to be acquired using one detector modality (e.g., HAADF detector modality) or at least two detector modalities (e.g., bright field and dark field detector modalities or HAADF detector modality and a spectroscopy detector modality).

The imaging logic 204 can receive detector data from the charged particle microscope system. In some examples, the imaging logic 204 can construct initial images of the sample from the detector data. For example, as the charged particle beam scans across an area of the sample (e.g., in a raster pattern), the charged particle microscope detector system generates an output for each (x, y) scanning beam position and tilt angle of the sample. The detector output for each scanning beam position can provide information for a pixel of the sample image. The imaging logic 204 can use the detector output to construct one or more initial images of the sample. In some examples, the imaging logic 204 can apply time stamps to the initial images constructed and store the initial images in the data storage (192 in FIG. 1) for use by other components of the sample imaging application 200.

Figure 3A:
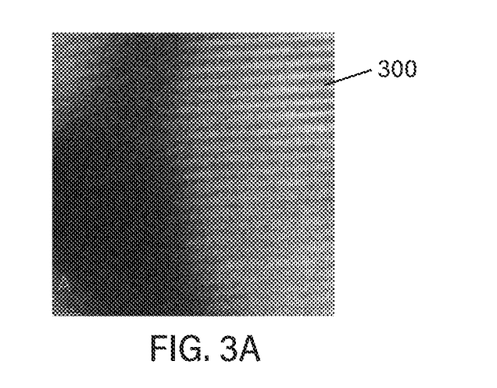
FIG. 3A illustrates a low signal-to-noise (SNR) image acquired with a charged particle microscope system.

The atom structure prediction logic 208 can perform various functions related to predicting atom structure probability in the initial images generated by the imaging logic 204. In some examples, the initial images can have a low SNR. FIG. 3A shows an example of a low SNR image 300 acquired from an area of a sample by a HAADF detector. In one implementation, the atom structure prediction logic 208 can take one or more low SNR images, such as the low SNR image 300 shown in FIG. 3A, and predict atom structure probability in the region of the sample corresponding to the one or more low SNR images. The output of the atom structure prediction logic 208 can be an atom structure probability image, which is an image in which there is detectible contrast between the regions of the image likely to contain atom structures and the regions of the image not likely to contain atom structures.

In one example, the atom structure prediction logic 208 predicts atom structure probability using a trained machine learning model. For example, the trained machine learning model can be a neural network (e.g., a convolutional neural network) that has been trained to predict atom structure probability. In one example, the atom structure prediction logic 208 can generate an inference request including a set of one or more initial images (or acquired images). The set of one or more initial images can form an input vector for a trained neural network. In some examples, the set of one or more initial images can be images acquired with the same detector modality. In other examples, the set of one or more initial images can be images acquired with different detector modalities. The atom structure prediction logic 208 can transmit the inference request to an inference engine 220 including a trained machine learning model 224. The inference engine 220 can be in the same computing environment as the sample imaging application 200 or can be in a different computing environment (e.g., on an AI server in a cloud).

Figure 3B:
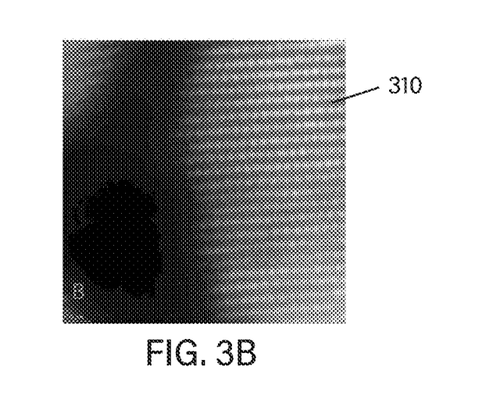
FIG. 3B illustrates a predicted image generated by a trained machine learning network based on the low SNR image of FIG. 3A.

Upon receiving the inference request, the inference engine 220 applies the set of one or more initial images in the inference request to the input of the trained machine learning model 224 to obtain a prediction. The prediction can be an image including atom structure probability. FIG. 3B shows an example of a predicted image 310 outputted by a trained neural network based on the low SNR image 300 shown in FIG. 3A (the probable regions of the image 310 containing atom structures have a higher pixel intensity compared to the regions of the image that are not likely to contain atom structures). The inference engine 220 generates an inference including the predicted image. The inference engine 220 can add other information to the inference, such as a confidence of the prediction of the neural network and/or explanation of the prediction of the neural network. The inference engine 220 returns the inference to the atom structure prediction logic 208.

The confidence of the predictions made by the trained machine learning model 224 can be determined using the same techniques that exist for the verification of artificial neural networks. For example, the trained machine learning model 224 can be applied to a low quality image (or low SNR image), and the prediction of the trained machine learning model 224 can be compared to a high quality image (or high SNR image) to determine a confidence of the prediction. The low and high quality images can be either generated with different imaging conditions or simulated by artificially degrading high quality images coming either from measurement or from a simulation.

Figure 3C:
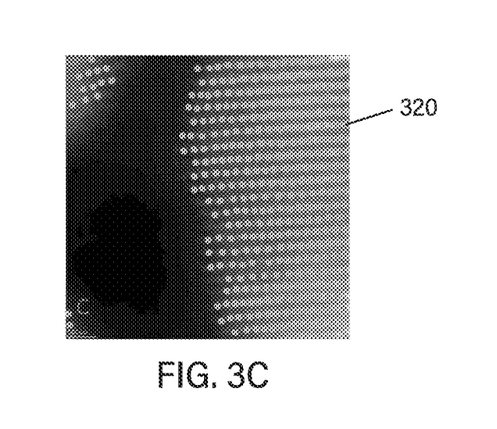
FIG. 3C illustrates an enhanced image generated based on the predicted image of FIG. 3B.

The atom position detection logic 210 can extract atom positions from the predicted image including atom structure probability. In one example, the atom position detection logic 210 uses image segmentation to extract the atom positions from the atom structure probability image. Various types of image segmentation techniques can be used. One technique can be based on thresholding. In thresholding, a pixel intensity threshold is set for classifying pixels in the atom structure probability image into atom structure pixel and background pixel. The atom position detection logic 210 can output the atom positions or can output an enhanced image indicating the atom positions. In one example, the enhanced image can be generated by superimposing the atom positions on the predicted image. FIG. 3C shows an example of an enhanced image 320 including atom positions, as determined by the atom position detection logic 210, superimposed on the predicted image 310 in FIG. 3B (the large dots indicate the atom positions).

The user interface logic 216 can perform various functions related to displaying a user interface on the display device 188, responding to events triggered from the user interface, and collecting user input from the user interface. For example, the user interface logic 216 can receive images from the atom structure prediction logic 208 and/or atom position detection logic 210. The user interface logic 216 can cause a graphical representation of at least a portion of the images to be presented in a designated area of the user interface. In one example, as an area of the sample is scanned during navigation on the sample or in-situ experiment, the user interface logic 216 can present a sequence of images in the user interface. The sequence of images can include one or more acquired images of the area of the sample and one or more enhanced images generated based on the acquired image(s).

The user interface logic 216 can receive inputs entered at the user interface by the user. In one example, the inputs can be settings for the charged particle microscope system or annotations to images presented in the user interface. In some cases, the user can select a control on the user interface to start imaging of an area of the sample. In this case, the user interface logic 216 can receive the request to start imaging and transmit the request to the imaging logic 204. The user interface logic 216 can cause other information to be displayed in the user interface, such as one or more metrics related to the operation of the trained machine learning model in the inference engine 220.

In some cases, the sample imaging application 200 can include training logic 214, which can generate a request to train or retrain a machine learning model to predict atom structure probability from low SNR images. In one example, the training logic 214 can generate a training request and transmit the training request to a training engine 230 for training of a machine learning model 228.

The training engine 230 can receive a training request from the training logic 214 and train the machine learning model 228 to perform the task of predicting atom structure probability in a low SNR image. In some examples, the training engine 230 can be in the same computing environment as the sample imaging application 200. In other examples, the training engine 230 can be in a remote machine learning environment in a cloud. After training the machine learning model 228, the training engine 230 can notify the training logic 214. In response to the notification, the training logic 214 can deploy the trained machine learning model 224 (produced by training of the machine learning model 228) to the inference engine 220 for use in making predictions.

The sample imaging application 200 can be stored in one or more computer readable storage media or computer readable storage devices and executed by one or more processors (e.g., processor 180 in the computing environment 116 shown in FIG. 1). Any of the computer-readable media herein can be non-transitory (e.g., volatile memory such as DRAM or SRAM, nonvolatile memory such as magnetic storage, optical storage or the like) and/or tangible.

Example—Training Dataset for Machine Learning

The training engine 230 can receive a training request from the sample imaging application 200. The training request can include a training dataset 232, or the training engine 230 can retrieve the training dataset 232 from a data storage (e.g., data storage 192 in FIG. 1), or the training engine 230 can generate the training dataset 232. The training dataset 232 can include any combination of simulated images, real images, and acquired images of atom structure. Preferably, the training dataset 232 contains images from conditions (e.g., noise statistics and level and atom grid structure) similar to target use cases and materials.

In one example, the training dataset 232 can include low SNR images of samples acquired with the charged particle microscope system. Each low SNR image can be tagged with the name of the sample and the region on the sample where the low SNR image is obtained. The training dataset can further include high SNR images of the samples acquired with the charged particle microscope system. Each high SNR image can be tagged with the name of the sample and the region on the sample where the high SNR image is obtained. Input-output pairs for the training dataset 232 can be generated by pairing each low SNR image (as input) with one of the high SNR images (as output), using matching sample name and region tags as the pairing criteria. In some cases, two or more low SNR images acquired with different detector modalities (as input) can be paired with one of the high SNR images (as output). In some cases, instead of acquiring low SNR images directly from the charged particle microscope system, the acquired high SNR images can be artificially degraded to form the low SNR images that are used in the training dataset.

In another example, the training dataset 232 can include simulated images of atom structures generated based on the atom structure model and noise model. A machine learning model can be trained and executed to generate the simulated images. One example of a technique for generating simulated images is described in Lin, R., Zhang, R., Wang, C. et al. TEMImageNet training library and AtomSegNet deep-learning models for high-precision atom segmentation, localization, denoising, and deblurring of atomic-resolution images. *Sci Rep* 11, 5386 (2021).

In another example, the training dataset can include real images obtained from open access electron microscopy datasets, such as the Warwick electron microscopy datasets available at github.com/Jeffrey-Ede/datasets/wiki and described in Jeffrey M Ede, "Warwick Electron Microscopy Datasets," 2020 Mach. Learn." Sci. Technol. 1 045003.

Example—Training of Machine Learning Model

In one example, the training engine 230 trains the machine learning model 228 using supervised training cycles interleaved with unsupervised training cycles. In one example, a few supervised cycles (for example, two or more supervised cycles) can be followed by a few unsupervised cycles (for example, two or more unsupervised cycles).

In one example, the supervised training and unsupervised training can use a cycle generative adversarial network (CycleGAN) model architecture (see Jun-Yan Zhu, Taesung Park, Phillip Isola, and Alexei A. Efros, "Unpaired Image-to-Image Translation using Cycle-Consistent Adversarial Networks," arXiv:1703.10593v7, Aug. 24, 2020).

Figure 6:
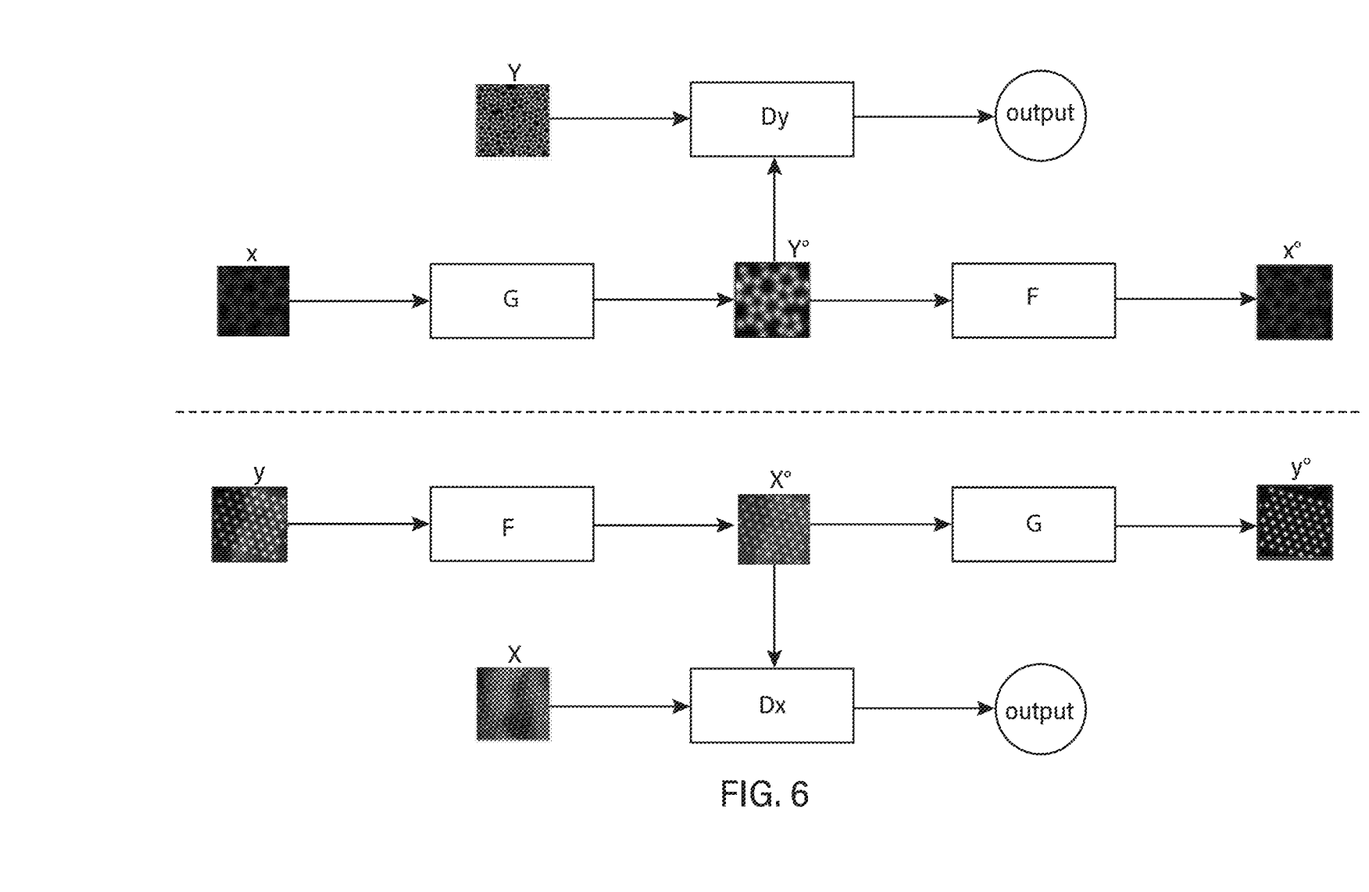
FIG. 6 is an illustration of an implementation of a cycle generative adversarial network (CycleGAN).

FIG. 6 illustrates a CycleGAN architecture including two generators G and F. The generator G maps data from domain X to Y. The generator F maps data from domain Y to X. The CycleGan architecture includes two discriminators Dx and Dy. The discriminator Dy encourages the generator G to transform X into outputs that are indistinguishable from domain Y. The discriminator Dx encourages the generator F to transform Y into outputs that are indistinguishable from domain X. The discriminators Dx and Dy are used only during unsupervised training.

The training includes a forward cycle and a backward cycle. In the forward cycle, the generator G takes input x and generates output $Y^o$, and the generator F takes $Y^o$ as input and generates output $x^o$. The input x and output $x^o$ should be similar. The difference between x and $x^o$ is cycle consistency loss in the forward direction and can be included in optimization of the network. In the backward cycle, the generator G takes input y and generates output $X^o$, and the generator G takes $X^o$ as input and generates output $y^o$. The input y and output $y^o$ should be similar. The difference between y and $y^o$ is cycle consistency loss in the backward direction and can be included in optimization of the network.

The discriminators Dx and Dy are used for unsupervised training. In the forward cycle, the discriminator Dy takes $Y^o$ and Y as input and produces an output that signifies real or fake. In the backward cycle, the discriminator Dx takes $X^o$ and X as input and produces an output that signifies real or fake. In unsupervised training, the input images x and y are unpaired and are noisy images (e.g., low SNR images). The images X and Y are real images (e.g., high SNR images).

During supervised training, the discriminators Dx and Dy are not used. The G network is run independently from the large structure using a simulated image as input x and a paired real image as the label y. The F network is also run independently from the large structure using a real image as input y and a paired simulated image as label x.

The CycleGAN alternates between the supervised training mode and the unsupervised training mode after a couple of cycles in one of the modes.

The generators and discriminators can be convolutional neural networks. In one example, a U-Net architecture can be used for the generators G and F. A U-Net is a convolutional neural network that was developed for biomedical image segmentation (see Olaf Ronneberger et al., "U-Net Convolutional Networks for Biomedical Image Segmentation", arXiv:1505.04597, May 18, 2015). In one specific example, a parameterized U-Net structure having a 256×256 input with 8 multi-resolution layers can be used for the generators. Other types of convolutional neural networks, such as VGG architecture or SUNet: Swin Transformer UNet for Image Denoising, can be used for the generators. In one example, the discriminators can be a PatchGAN discriminator, which is a convolutional network where an input image is mapped to an N×N array instead of a single scalar vector.

Example—Sample Imaging Method with Live Assistance

Figure 4A:
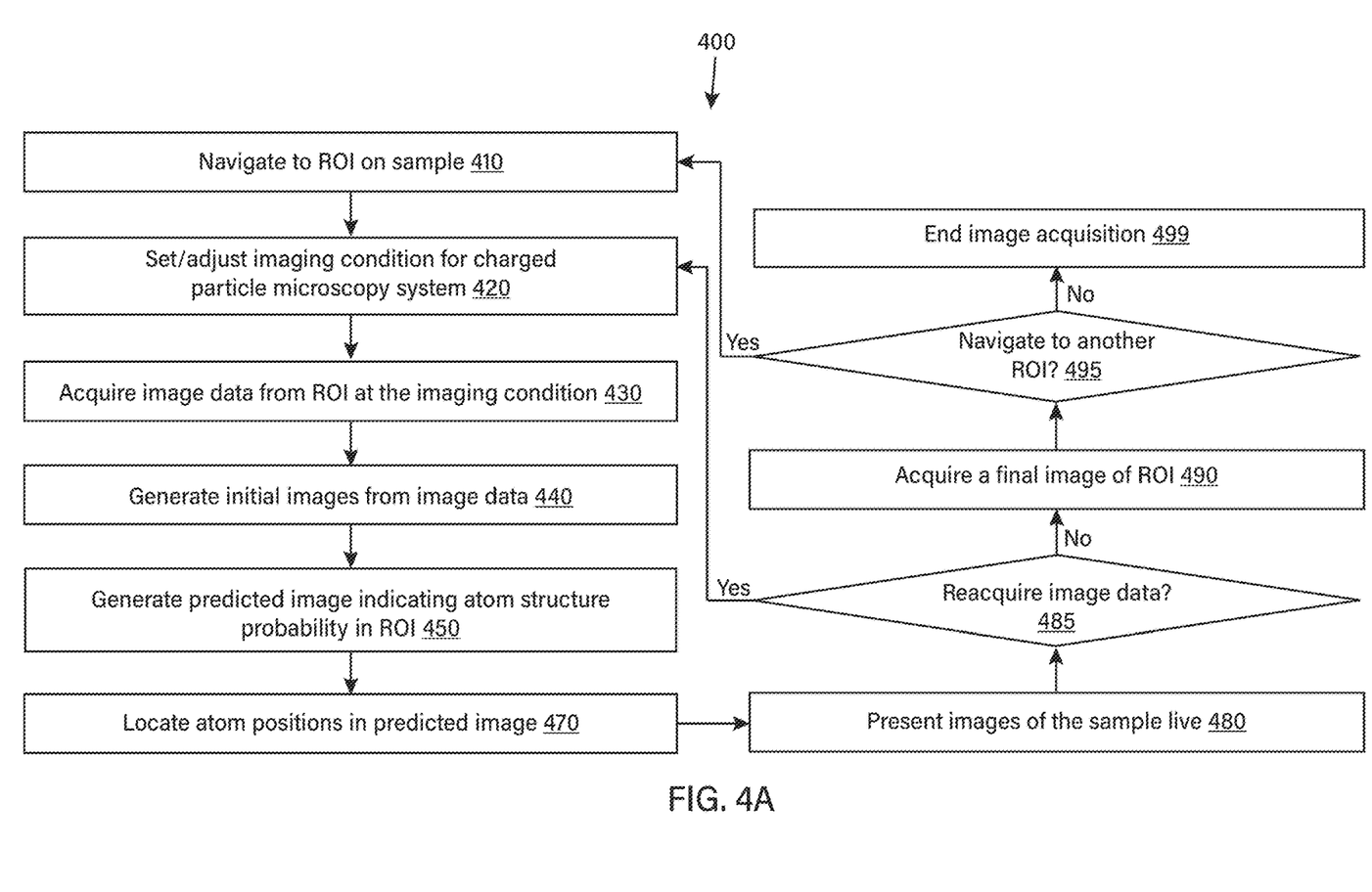
FIG. 4A is a flow diagram illustrating a method of navigating around a sample with charged particle microscopy.
Figure 4B:
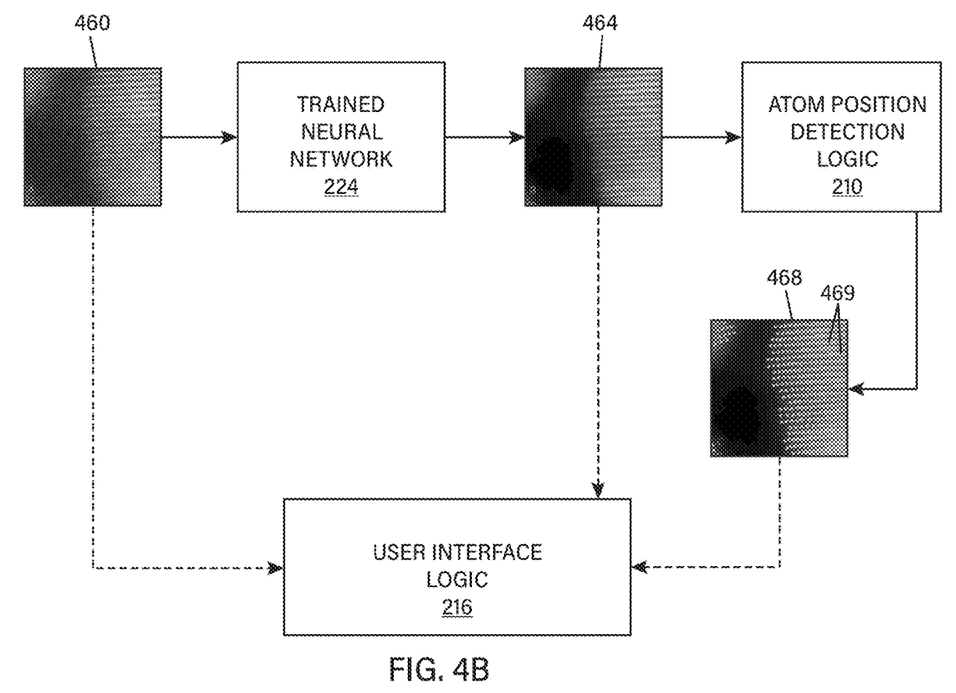
FIG. 4B is a flow diagram illustrating a portion of the method depicted in FIG. 4A.

FIG. 4A is a flow diagram illustrating an exemplary method 400 of imaging a sample with a charged particle microscope system, according to one implementation. FIG. 4B is a block diagram illustrating a portion of the method 400. The method 400 can be performed with the system depicted in FIG. 1 and the sample imaging application depicted in FIG. 2. Operations are illustrated once and each and in a particular order in FIGS. 4A and 4B, but the operations may be reordered and/or repeated as desired and appropriate (e.g., different operations illustrated as performed sequentially may be performed in parallel as suitable).

At 410, the method includes navigating to a region of interest (ROI) on the sample. For example, the sample can be positioned such that the ROI is within a field of view of a charged particle beam outputted by the charged particle microscope system. The positioning of the sample can include transmitting appropriate controls to the sample holder (e.g., by the controller of the charged particle microscope system) to adjust the position of the sample relative to the charged particle beam).

At 420, the method includes setting an imaging condition for the sample. The imaging condition can be set by adjusting one or more imaging parameters of the charged particle microscope system. For example, the method can include setting the dose of the charged particle beam to apply to the sample. If the images are to be produced by scanning the ROI, the method can include setting the dwell time or scan speed or scan pattern of the charged particle beam. The method can further include activating the detector systems to use in acquiring the image data. The method can further include adjusting a tilt angle of the sample. The parameter settings may come from the sample imaging application and can be applied by the controller of the charged particle microscope system.

At 430, the method includes acquiring image data from the ROI at the imaging condition set in operation 420. For example, while the charged particle beam is incident on the ROI, the activated detector system(s) can collect image data produced from the interaction between the charged particle beam and the ROI. In some examples, the ROI can be scanned by sweeping the charged particle beam across the ROI in a raster pattern (or another scan pattern). The activated detector system(s) can capture the image data as the ROI is scanned. In some examples, image data can be captured with a single detector modality (e.g., HAADF detector modality). In other examples, image data can be captured with at least two different detector modalities (e.g., dark field and bright field detector modalities or a diffraction detector modality (e.g., HAADF detector modality) and spectra detector modality (e.g., electron energy loss spectroscopy or energy dispersive X-ray spectroscopy). In other examples, a camera can capture images of the sample. The camera can include, for example, a CCD (charged-coupled device) imaging sensor, a CMOS (complementary metal-oxide-semiconductor) imaging sensor, or, more generally, an array of photodetectors. The camera can be operated in a "movie" mode to capture a sequence of images of the sample.

At 440, the method includes generating a set of one or more initial images (or acquired images) from the image data acquired in operation 430. For example, the image data can include charged particle intensities measured at each scan position of the charged particle beam. Each intensity can correspond to a pixel of the initial image. The initial image can be constructed as a set of pixels, where the pixel coordinates are correlated to the scan position of the beam position and the pixel value is determined by the measured intensity corresponding to the scan position of the beam. In some examples, the imaging condition set in operation 420 results in initial image(s) with a low SNR (i.e., low SNR image(s)).

At 450, the method includes generating a predicted image indicating atom structure probability in the ROI using a trained machine learning model. In one example, the trained machine learning model is a neural network (e.g., a convolutional neural network) that has been trained to predict atom structure probability based on one or more low SNR images. The output of the neural network can be a predicted image indicating atom structure probability. In one example, one or more of the initial images generated in operation 440 can be applied to the input of the trained machine learning model to obtain the predicted image. For illustrative purposes, FIG. 4B depicts a low SNR image 460 applied to an input of the trained machine learning model 224, which then generates a predicted image 464 indicating atom structure probability. In some cases, two or more low SNR images can be applied to the input of the trained machine learning model 224 (e.g., two or more low SNR images captured with different detector modalities), and the trained machine learning model 224 can output the predicted image based on the two or more low SNR images.

At 470, the method includes locating atom positions in the predicted image generated in operation 450. In one example, the atom positions can be located using image segmentation. Various types of image segmentations can be used. One example of an image segmentation technique is thresholding. In thresholding, a pixel intensity threshold is set for classifying pixels in the predicted image into atom pixel and background pixel. The method can include generating an enhanced image by superimposing atom objects (e.g., geometrical shapes representing atoms) on the predicted image at the atom locations found by the image segmentation. For illustrative purposes, FIG. 4B shows the predicted image 464 inputted to the atom position detection logic 210. FIG. 4B shows an enhanced image 468 revealing atom locations (the large dots 469) in the predicted image 464.

At 480, the method can include presenting images of the sample live on a display. In some examples, the method can include recording the images for replaying after the image acquisition. Any combination of the images generated in operations 440, 450, and 470 can be presented and/or recorded. FIG. 4B shows that any of the images 460, 464, and 468 can be provided to the user interface logic 216, which can update the user interface live with the images. In one example, an initial image (e.g., a low SNR image) can be presented, followed by a predicted image generated based on the initial image, followed by an enhanced image generated based on the predicted image. In some examples, the predicted image can be displayed along with confidence of the prediction. The images can be presented within a user interface to allow user interaction with the images. For example, the user may zoom into a portion of the enhanced image and select or tag the portion of the image for further investigation. In another example, the user may detect that the charged particle beam is not correctly aligned with the atom columns in the ROI and may determine an adjustment to make to the tilting of the sample based on the images.

At 485, the method can include determining whether to reacquire image data from the ROI. For example, the method may determine whether to reacquire image data from the ROI based on user input. For example, if the user detects that the sample is not in proper alignment with the charged particle beam, the user may adjust the setting for the sample tilt angle through the user interface and trigger image data reacquisition of the ROI. In another example, if the user detects that the charged particle beam dose is either too small or too large, the user may adjust the imaging conditions and trigger image data reacquisition of the ROI. If the method determines that the image data is to be reacquired, the method may reacquire the image data by returning to operation 420 and adjusting the imaging condition (e.g., based on user input). If the method determines that it is not necessary to reacquire image data for the ROI, the method can continue to operation 490.

At 490, the method includes acquiring a final image of the ROI. The final image can be acquired at an imaging condition that is different from the one used in operation 420 to acquire the initial image(s) of the ROI. In particular, the imaging condition used in acquiring the final image can result in a final image with a higher SNR than the initial image(s). In some examples, the charged particle beam dose used in acquiring the final image can be higher than the charged particle beam dose used in acquiring the initial image(s) and/or the scan speed used in acquiring the final image can be lower than the scan speed used in acquiring the initial image(s) and/or the scan pattern used in acquiring the low SNR images can be sparser than the scan pattern used in acquiring the final image.

At 495, the method can include determining whether to navigate to another ROI on the sample. If the method determines that another ROI on the sample should be processed, the method can return to operation 410 to navigate to the new ROI. In some cases, a user can indicate through the user interface that another ROI should be processed. As part of indicating that another ROI should be processed, the user may specify the new ROI. Alternatively, the method may automatically determine the new ROI to process based on a predetermined experiment or navigation plan.

At 499, if the method determines that processing of another ROI is not needed, image acquisition can be terminated.

Example—Graphical User Interface

Figure 5:
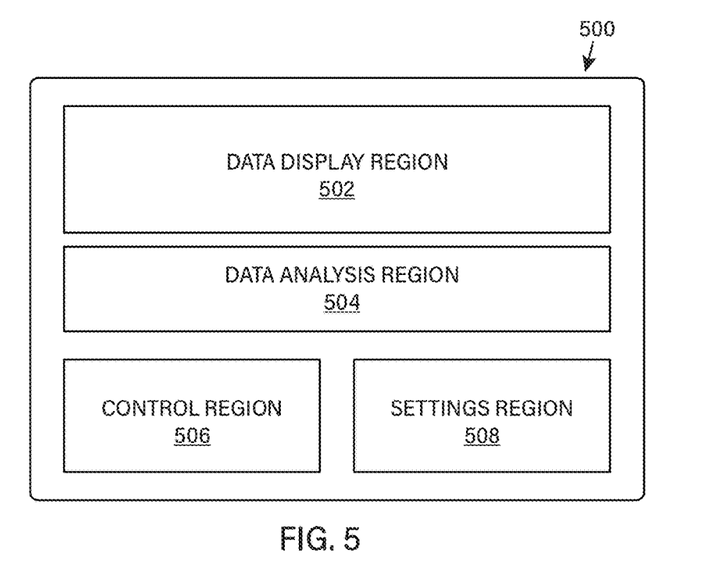
FIG. 5 is an example graphical user interface that may be presented by the sample imaging application depicted in FIG. 2, according to one implementation.

FIG. 5 depicts an example graphical user interface (GUI) 500 that may be presented by the sample imaging application on a display device. A user may interact with the GUI 500 using any suitable input device and input technique (e.g., movement of a cursor, motion capture, facial recognition, gesture detection, voice recognition, actuation of buttons, etc.).

The GUI 500 may include a data display region 502, a data analysis region 504, charged particle microscope control region 506, and a settings region 508. The particular number and arrangement of regions depicted in FIG. 5 are simply illustrative, and any number and arrangement of regions, including any desired features, may be included in a GUI 500.

The data display region 502 may display images generated by the sample imaging application. For example, the data display region 502 may display any of the low resolution structure images, structure position images, structure object images, and structure type images.

The data analysis region 504 may display results of data analysis. For example, the data analysis region 504 may display regions of interest indicated by the user in images displayed in the data display region. In some examples, the data display region 502 and the data analysis region 504 may be combined in the GUI 500.

The charged particle microscope control region 506 may include options that allow the user to control the charged particle microscope system. For example, the charged particle microscope control region 506 may include user selectable options that allow parameters of the charged particle microscope system to be adjusted.

The settings region 508 may include options that allow the user to control the features and functions of the GUI 500 and/or perform other computing operations with respect to the data display region 502 and data analysis region 502 (e.g., saving data on a storage device).

In view of the above described implementations of the disclosed subject matter, this application discloses the additional examples enumerated below. It should be noted that one feature of an example in isolation or more than one feature of the example taken in combination and, optionally, in combination with one or more features of one or more further examples are further examples also falling within the disclosure of this application.

Example 1 is a method of imaging a sample with a charged particle microscope system including acquiring one or more first images of a region of the sample at a first imaging condition with the charged particle microscope system; applying the one or more first images to an input of a trained machine learning model to obtain a predicted image indicating atom structure probability in the region of the sample; and in response to obtaining the predicted image, causing display of an enhanced image indicating atom locations in the region of the sample based on the atom structure probability in the predicted image.

Example 2 includes the subject matter of Example 1 and further includes acquiring a second image of the region of the sample at a second imaging condition with the charged particle microscope system, wherein the second imaging condition is selected based on the predicted image or the enhanced image such that the second image has a higher signal-to-noise ratio compared to the one or more first images.

Example 3 includes the subject of Example 2 and further specifies that acquiring the second image of the region of the sample is triggered from the user interface after displaying the enhanced image.

Example 4 includes the subject matter of Example 2 and further specifies that a charged particle beam dose in the first imaging condition is lower than a charged particle beam dose in the second imaging condition.

Example 5 includes the subject matter of Example 2 and further specifies that a first scan pattern used in acquiring the one or more first images is sparse compared to a second scan pattern used in acquiring the second image.

Example 6 includes the subject matter of any one of Examples 1 to 5 and further includes displaying the one or more first images and at least one of the predicted image and the enhanced image in a sequence on a user interface.

Example 7 includes the subject matter of any one of Examples 1 to 6 and further specifies that acquiring the one or more first images of the region of the sample includes scanning a charged particle beam over the region of the sample.

Example 8 includes the subject matter of Example 7 and further specifies that acquiring the one or more first images of the region of the sample further comprises collecting image data from the region of the sample with a single detector modality and constructing the one or more first images from the collected image data.

Example 9 includes the subject matter of Example 8 and further specifies that the single detector modality is a high-angle annular dark field detector modality.

Example 10 includes the subject matter of Example 7 and further specifies that acquiring the one or more first images of the region of the sample includes collecting image data from the region of the sample with at least two different detector modalities and constructing the one or more first images from the collected image data.

Example 11 includes the subject matter of Example 10 and further specifies that the at least two different detector modalities comprise a dark field detector modality, an annular dark field detector modality, a bright field detector modality, an annular dark field detector modality, a high-angle annular dark field detector, a segmented scanning transmission electron microscopy detector, or an integrated differential phase contrast detector.

Example 12 includes the subject matter of Example 10 and further specifies that the at least two different detector modalities comprise a diffraction detector modality or a spectra detector modality.

Example 13 includes the subject matter of any one of Examples 1 to 12 and further specifies that the trained machine learning model is trained using a mixture of supervised learning and unsupervised learning.

Example 14 includes the subject matter of any one of claims 1 to 13 and further specifies that the trained machine learning model is trained using a cycle generative adversarial network.

Example 15 includes the subject matter of any one of Examples 1 to 14 and further specifies that the trained machine learning model includes a convolutional neural network.

Example 16 includes the subject matter of any one of Examples 1 to 15 and further specifies that causing display of the enhanced image includes applying image segmentation to the predicted image to find the atom locations.

Example 17 includes the subject matter of Example 16 and further specifies that applying image segmentation to the predicted image includes classifying pixels of the predicted image based on a pixel intensity threshold.

Example 18 is a method for scanning a sample with a charged particle microscope system including adjusting the sample to different positions relative to a field of view of a charged particle beam at different times during an image acquisition; scanning a region of the sample with a charged particle beam at one of the different positions and under a first imaging condition; acquiring one or more first images of the region from the scanning under the first imaging condition; applying the one or more first images to an input of a trained machine learning model to obtain a predicted image indicating atom structure probability in the region of the sample; responsive to obtaining the predicted image, causing display of an enhanced image indicating atom locations in the region of the sample based on the atom structure probability in the predicted image; scanning the region of the sample with the charged particle beam at the one of the different positions and under a second imaging condition that is different from the first imaging condition; and acquiring a second image of the region of the sample from the scanning under the second imaging condition.

Example 19 includes the subject matter of Example 18 and further specifies that the one or more first images have a lower signal-to-noise ratio compared to the second image.

Example 20 is a charged particle microscope support apparatus including first logic to cause a charged particle microscope system to generate one or more first images of a sample having a signal-to-noise ratio below a threshold; second logic to apply the one or more first images to an input of a trained machine learning model to generate a predicted image indicating atom structure probability in the sample; third logic to generate an enhanced image revealing atom locations in the sample based on the atom structure probability in the predicted image; and fourth logic to cause the charged particle microscope system to generate a second image of the sample having a signal-to-noise ratio above the threshold.

Example 21 is a system for scanning a sample including a sample holder configured to hold a sample; a charged particle source configured to emit a beam of charged particles towards the sample; an optical system configured to cause the beam of charged particles to be incident on the sample; one or more detectors configured to detect charged particles of the charged particle beam and/or radiation resultant from the charged particle beam being incident on the sample; one or more processors; and a memory storing computer readable instructions that, when executed by the one or more processors, cause the system to: scan a region of the sample with the charged particle beam during an image acquisition; acquire one or more first images of a region of the sample at a first imaging condition; apply the one or more first images to an input of a trained machine learning model to obtain a predicted image indicating atom structure probability in the region of the sample; and cause display of an enhanced image revealing atom locations in the region of the sample based on the atom structure probability in the predicted image.

Example 22 includes the subject matter of Example 21 and further specifies that the computer readable instructions, when executed by the one or more processors, further cause the system to acquire a second image of the region of the sample at a second imaging condition, wherein the second imaging condition is selected based on the predicted image or the enhanced image such that the second image has a higher signal-to-noise ratio compared to the one or more first images.

The invention claimed is:

1. A method of imaging a sample with a charged particle microscope system, the method comprising:
    acquiring one or more first images of a region of the sample at a first imaging condition with the charged particle microscope system;
    applying the one or more first images to an input of a trained machine learning model to obtain a predicted image indicating atom structure probability in the region of the sample; and
    in response to obtaining the predicted image, causing display of an enhanced image indicating atom locations in the region of the sample based on the atom structure probability in the predicted image.

2. The method of claim 1, further comprising acquiring a second image of the region of the sample at a second imaging condition with the charged particle microscope system, wherein the second imaging condition is selected based on the predicted image or the enhanced image such that the second image has a higher signal-to-noise ratio compared to the one or more first images.

3. The method of claim 2, wherein acquiring the second image of the region of the sample is triggered from the user interface after displaying the enhanced image.

4. The method of claim 2, wherein a charged particle beam dose in the first imaging condition is lower than a charged particle beam dose in the second imaging condition.

5. The method of claim 2, wherein a first scan pattern used in acquiring the one or more first images is sparse compared to a second scan pattern used in acquiring the second image.

6. The method of claim 1, further comprising displaying the one or more first images and at least one of the predicted image and the enhanced image in a sequence on a user interface.

7. The method of claim 1, wherein acquiring the one or more first images of the region of the sample comprises scanning a charged particle beam over the region of the sample.

8. The method of claim 7, wherein acquiring the one or more first images of the region of the sample further comprises collecting image data from the region of the sample with a single detector modality and constructing the one or more first images from the collected image data.

9. The method of claim 8, wherein the single detector modality is a high-angle annular dark field detector modality.

10. The method of claim 7, wherein acquiring the one or more first images of the region of the sample further comprises collecting image data from the region of the sample with at least two different detector modalities and constructing the one or more first images from the collected image data.

11. The method of claim 10, wherein the at least two different detector modalities comprise a dark field detector modality, an annular dark field detector modality, a bright field detector modality, an annular dark field detector modality, a high-angle annular dark field detector, a segmented scanning transmission electron microscopy detector, or an integrated differential phase contrast detector.

12. The method of claim 10, wherein the at least two different detector modalities comprise a diffraction detector modality or a spectra detector modality.

13. The method of claim 1, wherein the trained machine learning model is trained using a mixture of supervised learning and unsupervised learning.

14. The method of claim 13, wherein the trained machine learning model is trained using a cycle generative adversarial network.

15. The method of claim 1, wherein the trained machine learning model comprises a convolutional neural network.

16. The method of claim 1, wherein causing display of the enhanced image comprises applying image segmentation to the predicted image to find the atom locations.

17. The method of claim 16, wherein applying image segmentation to the predicted image comprises classifying pixels of the predicted image based on a pixel intensity threshold.

18. A charged particle microscope support apparatus comprising:
   first logic to cause a charged particle microscope system to generate one or more first images of a sample having a signal-to-noise ratio below a threshold;
   second logic to apply the one or more first images to an input of a trained machine learning model to generate a predicted image indicating atom structure probability in the sample;
   third logic to generate an enhanced image revealing atom locations in the sample based on the atom structure probability in the predicted image; and
   fourth logic to cause the charged particle microscope system to generate a second image of the sample having a signal-to-noise ratio above the threshold.

19. A system for scanning a sample, the system comprising:
   a sample holder configured to hold a sample;
   a charged particle source configured to emit a beam of charged particles towards the sample;
   an optical system configured to cause the beam of charged particles to be incident on the sample;
   one or more detectors configured to detect charged particles of the charged particle beam and/or radiation resultant from the charged particle beam being incident on the sample;
   one or more processors; and
   a memory storing computer readable instructions that, when executed by the one or more processors, cause the system to:
      scan a region of the sample with the charged particle beam during an image acquisition;
      acquire one or more first images of a region of the sample at a first imaging condition;
      apply the one or more first images to an input of a trained machine learning model to obtain a predicted image indicating atom structure probability in the region of the sample; and
      cause display of an enhanced image revealing atom locations in the region of the sample based on the atom structure probability in the predicted image.

20. The system of claim 19, wherein the computer readable instructions, when executed by the one or more processors, further cause the system to acquire a second image of the region of the sample at a second imaging condition, wherein the second imaging condition is selected based on the predicted image or the enhanced image such that the second image has a higher signal-to-noise ratio compared to the one or more first images.

* * * * *